(12) United States Patent
Fareed et al.

(10) Patent No.: US 11,011,515 B2
(45) Date of Patent: May 18, 2021

(54) NORMALLY OFF III NITRIDE TRANSISTOR

(71) Applicant: Texas Instruments Incorporated, Dallas, TX (US)

(72) Inventors: Qhalid Fareed, Richardson, TX (US); Naveen Tipirneni, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/988,618

(22) Filed: May 24, 2018

(65) Prior Publication Data

US 2018/0277535 A1     Sep. 27, 2018

Related U.S. Application Data

(62) Division of application No. 14/673,844, filed on Mar. 30, 2015, now abandoned.

(51) Int. Cl.
*H01L 27/088*     (2006.01)
*H01L 29/66*     (2006.01)
(Continued)

(52) U.S. Cl.
CPC .... *H01L 27/0883* (2013.01); *H01L 21/30612* (2013.01); *H01L 21/30621* (2013.01);
(Continued)

(58) Field of Classification Search
CPC ............. H01L 27/0883; H01L 27/0605; H01L 21/30612; H01L 21/30621; H01L 21/8252;
(Continued)

(56) References Cited

U.S. PATENT DOCUMENTS

2006/0186422 A1    8/2006   Gaska et al.
2006/0219997 A1    10/2006   Kawasaki
(Continued)

FOREIGN PATENT DOCUMENTS

CN           101107713 A      1/2008

OTHER PUBLICATIONS

European Patent Search Report, dated Feb. 13, 2018, PCT/US2016024495.
(Continued)

*Primary Examiner* — Thao X Le
*Assistant Examiner* — Gardner W. S. Swan
(74) *Attorney, Agent, or Firm* — Jacqueline J. Garner; Charles A. Brill; Frank D. Cimino

(57) ABSTRACT

A semiconductor device containing an enhancement mode GaN FET on a III-N layer stack includes a low-doped GaN layer, a barrier layer including aluminum over the low-doped GaN layer, a stressor layer including indium over the barrier layer, and a cap layer including aluminum over the stressor layer. A gate recess extends through the cap layer and the stressor layer, but not through the barrier layer. The semiconductor device is formed by forming the barrier layer with a high temperature MOCVD process, forming the stressor layer with a low temperature MOCVD process and forming the cap layer with a low temperature MOCVD process. The gate recess is formed by a two-step etch process including a first etch step to remove the cap layer, and a second etch step to remove the stressor layer.

16 Claims, 6 Drawing Sheets

(51) Int. Cl.
  *H01L 29/778* (2006.01)
  *H01L 21/8252* (2006.01)
  *H01L 27/06* (2006.01)
  *H01L 21/306* (2006.01)
  *H01L 29/423* (2006.01)
  *H01L 21/02* (2006.01)
  *H01L 29/20* (2006.01)
  *H01L 29/205* (2006.01)

(52) U.S. Cl.
  CPC ...... *H01L 21/8252* (2013.01); *H01L 27/0605* (2013.01); *H01L 29/66462* (2013.01); *H01L 29/7786* (2013.01); *H01L 21/02241* (2013.01); *H01L 29/2003* (2013.01); *H01L 29/205* (2013.01); *H01L 29/4236* (2013.01)

(58) Field of Classification Search
  CPC ........... H01L 21/02241; H01L 29/7786; H01L 29/66462; H01L 29/4236; H01L 29/205; H01L 29/2003
  See application file for complete search history.

(56) References Cited

U.S. PATENT DOCUMENTS

| | | |
|---|---|---|
| 2008/0203477 A1* | 8/2008 | Yamazaki ............ H01L 27/105 257/347 |
| 2009/0058532 A1 | 3/2009 | Kikkawa et al. |
| 2009/0072272 A1 | 3/2009 | Suh et al. |
| 2010/0117118 A1 | 5/2010 | Dabiran et al. |
| 2010/0270559 A1 | 10/2010 | Ota |
| 2010/0317132 A1* | 12/2010 | Rogers ................ H01L 25/0753 438/27 |
| 2011/0241020 A1 | 10/2011 | Saunier |
| 2012/0292663 A1 | 11/2012 | Lin et al. |
| 2013/0092958 A1 | 4/2013 | Chen et al. |
| 2013/0099284 A1 | 4/2013 | Tserng et al. |
| 2013/0146888 A1 | 6/2013 | Park et al. |
| 2013/0292690 A1 | 11/2013 | Ando et al. |
| 2013/0313561 A1 | 11/2013 | Suh |
| 2014/0252367 A1 | 9/2014 | Pendharkar et al. |
| 2014/0374765 A1 | 12/2014 | Curatola |
| 2015/0060875 A1 | 3/2015 | Kume et al. |
| 2016/0027964 A1* | 1/2016 | Park ....................... H01L 33/06 257/13 |
| 2016/0064539 A1 | 3/2016 | Lu et al. |
| 2016/0104703 A1 | 4/2016 | Parke et al. |

OTHER PUBLICATIONS

Mercier D et al: "The role of chelating agents on the corrosion mechanisms of aluminum in alkaline aqueous solutions", Corrosion Science, Oxford GB., vol. 51, No. 2, pp. 339-348.

* cited by examiner

NORMALLY OFF III NITRIDE TRANSISTOR

CROSS REFERENCE TO RELATED APPLICATIONS

This application is a divisional of U.S. Nonprovisional patent application Ser. No. 14/673,844, filed Mar. 30, 2015, the contents of which is herein incorporated by reference in its entirety.

FIELD OF THE INVENTION

This invention relates to the field of semiconductor devices. More particularly, this invention relates to III-N field effect transistors in semiconductor devices.

BACKGROUND OF THE INVENTION

An enhancement mode gallium nitride field effect transistor (GaN FET) includes a recessed gate extending into a stressor layer and barrier layer, and vertically separated from a low-doped gallium nitride (GaN) layer. Forming the gate recess by etching to have a desired vertical separation from the low-doped GaN layer is problematic. Timed etching results in unacceptable variation in the separation from the low-doped GaN layer. Forming the gate recess using etch-blocking layers produces defects in the barrier layer and/or the stressor layer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing an enhancement mode GaN FET on a III-N layer stack including a low-doped GaN layer, a barrier layer including aluminum disposed over the low-doped GaN layer, a stressor layer including indium disposed over the barrier layer, and a cap layer including aluminum disposed over the stressor layer. A gate recess of the enhancement mode GaN FET extends through the cap layer and the stressor layer, but not through the barrier layer. A gate dielectric layer is disposed in the gate recess and a gate is disposed on the gate dielectric layer.

The semiconductor device is formed by forming the barrier layer with a high temperature metal organic chemical vapor deposition (MOCVD) process, forming the stressor layer with a low temperature MOCVD process and forming the cap layer with a low temperature MOCVD process. The gate recess is formed by a two-step etch process including a first etch step to remove the cap layer, and a second etch step to remove the stressor layer.

DETAILED DESCRIPTION OF EXAMPLE EMBODIMENTS

Figure 1:
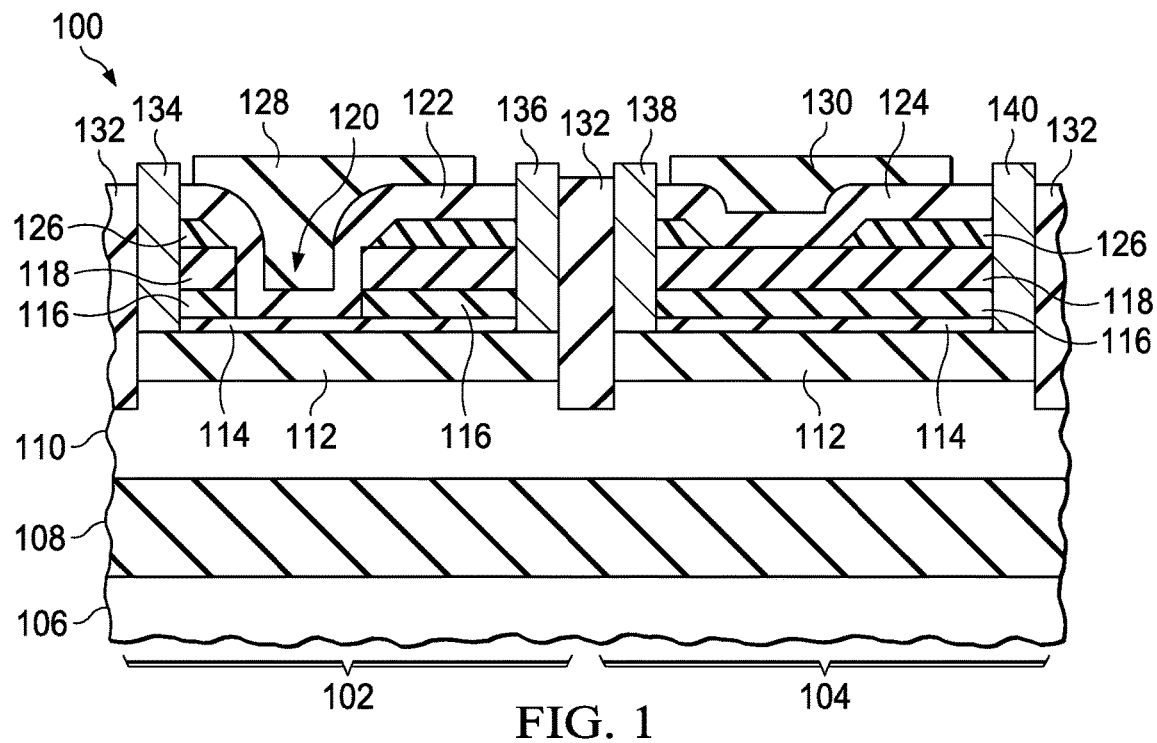
FIG. 1 is a cross section of an example semiconductor device.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing an enhancement mode GaN FET on a III-N layer stack including a low-doped GaN layer, a barrier layer including aluminum disposed over the low-doped GaN layer, a stressor layer including indium disposed over the barrier layer, and a cap layer including aluminum disposed over the stressor layer. A gate recess of the enhancement mode GaN FET extends through the cap layer and the stressor layer, but not through the barrier layer. A gate dielectric layer is disposed in the gate recess and a gate is disposed on the gate dielectric layer.

The semiconductor device may also include a depletion mode GaN FET with a planar gate over the cap layer and stressor layer. A gate dielectric layer and the planar gate of the depletion mode GaN FET may be formed concurrently with the gate dielectric layer and the gate of the enhancement mode GaN FET.

The semiconductor device is formed by forming the barrier layer with a high temperature MOCVD process, forming the stressor layer with a low temperature MOCVD process and forming the cap layer with a low temperature MOCVD process. The gate recess is formed by a two-step etch process including a first etch step to remove the cap layer, and a second etch step to remove the stressor layer. The stressor layer may be oxidized by an anodic oxidation process in the gate recess to facilitate removal by the second etch step.

For the purposes of this description, the term "III-N material" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms such as aluminum gallium nitride describing elemental compositions of materials do not imply a particular stoichiometry of the elements. For the purposes of this description, the term GaN FET is understood to refer to a field effect transistor which includes III-N semiconductor materials.

FIG. 1 is a cross section of an example semiconductor device. The semiconductor device 100 includes an enhancement mode GaN FET 102 and a depletion mode GaN FET 104. The semiconductor device 100 includes a substrate 106 which may be a wafer of silicon or other semiconductor material. A buffer layer 108 of III-N material is disposed over the substrate 106. The buffer layer 108 may include for example, 100 to 300 nanometers of aluminum nitride on the substrate 106 and 1 to 7 microns of graded layers of $Al_xGa_{1-x}N$ which is aluminum rich at a bottom surface, on the aluminum nitride, and gallium rich at a top surface of the buffer layer (108). An electrical isolation layer (110) is disposed on the buffer layer (108). The electrical isolation layer (110) may be, for example, 300 to 2000 nanometers of semi-insulating gallium nitride. The electrical isolation layer (110) may be, for example, semi-insulating to provide a desired level of electrical isolation between layers below the electrical isolation layer (110) and layers above the electrical isolation layer (110). Alternatively, the electrical isolation layer (110) may be doped with n-type or p-type dopants to reduce undesired effects of charge trapping on current density in the semiconductor device (100). A low-doped layer (112) is disposed on the electrical isolation layer (110). The low-doped layer (112) may be, for example, 25 to 1000 nanometers of gallium nitride. The low-doped layer (112) may be formed so as to minimize crystal defects which may have an adverse effect on electron mobility. The method of formation of the low-doped layer (112) may result in the low-doped layer (112) being doped with carbon, iron or other dopant species, for example with a net doping density less than $10^{17}$ cm$^{-3}$.

A barrier layer 114 is disposed over the low-doped layer 112. The barrier layer 114 may be primarily aluminum gallium nitride, with less than 1 atomic percent indium. The barrier layer 114 may have a stoichiometry of $Al_{0.10}Ga_{0.90}N$ to $Al_{0.30}Ga_{0.70}N$, and a thickness of 1 nanometers to 5 nanometers. A minimum thickness of the barrier layer 114 may be selected to provide ease and reproducibility of fabrication; a maximum thickness may be selected to provide a desired off-state current in the enhancement mode GaN FET 102, where increasing the thickness of the barrier layer 114 increases the off-state current. The thickness may depend on a stoichiometry of the barrier layer 114. For example, an instance of the barrier layer 114 with a stoichiometry of $Al_{0.10}Ga_{0.90}N$ to $Al_{0.30}Ga_{0.70}N$ may have a thickness of 1.5 nanometers to 2.0 nanometers.

A stressor layer 116 is disposed over the barrier layer 114. The stressor layer 116 is primarily indium aluminum nitride, with a stoichiometry of $In_{0.05}Al_{0.95}N$ to $In_{0.30}Al_{0.70}N$, and a thickness of 1 nanometers to 5 nanometers. In one version of the instant example, the stressor layer 116 may have a stoichiometry of $In_{0.16}Al_{0.84}N$ to $In_{0.18}Al_{0.82}N$ and a thickness of 3.5 nanometers to 4.5 nanometers, which may provide a desired balance between providing a desired charge density in a two-dimensional electron gas (2DEG), which decreases with indium content, and providing a desired etch selectivity to the underlying barrier layer 114, which increases with indium content. The stoichiometry of $In_{0.16}Al_{0.84}N$ to $In_{0.18}Al_{0.82}N$ may also provide a desired lattice match to the low-doped layer 112.

A cap layer 118 is disposed over the stressor layer 116. The cap layer 118 has less than 1 atomic percent indium, and may be primarily aluminum gallium nitride. A thickness of the cap layer is selected to prevent oxidation of the stressor layer 116 during subsequent fabrication steps. An example cap layer 118 may have a stoichiometry of $Al_{0.05}Ga_{0.95}N$ to $Al_{0.30}Ga_{0.70}N$, and a thickness of 4 nanometers to 20 nanometers. The cap layer 118 advantageously prevents oxidation of the indium in the stressor layer 116.

A gate recess 120 extends through the cap layer 118 and the stressor layer 116 in the enhancement mode GaN FET 102. The gate recess 120 may extend completely through the stressor layer 116 and not extend into the barrier layer 114, as depicted in FIG. 1. Alternatively, the gate recess 120 may extend partway into the barrier layer 114, or may extend only partway through the stressor layer 116 and stop short of the barrier layer 114.

An enhancement mode gate dielectric layer 122 is disposed in the gate recess 120 in the enhancement mode GaN FET 102. A depletion mode gate dielectric layer 124 is disposed over the cap layer in the depletion mode GaN FET 104. The enhancement mode gate dielectric layer 122 and the depletion mode gate dielectric layer 124 may be 5 nanometers to 50 nanometers thick and may include one or more layers of silicon dioxide, silicon nitride and/or aluminum oxide. In one version of the instant example, the enhancement mode gate dielectric layer 122 and the depletion mode gate dielectric layer 124 may have substantially equal thicknesses and compositions, possibly as a result of being formed concurrently. In an alternate version, the enhancement mode gate dielectric layer 122 and the depletion mode gate dielectric layer 124 may have different thicknesses and compositions, so as to separately optimize performance of the enhancement mode GaN FET 102 and the depletion mode GaN FET 104.

A field plate dielectric layer 126 may optionally be disposed over the cap layer 118 and under the enhancement mode gate dielectric layer 122 adjacent to the gate recess 120 and under the depletion mode gate dielectric layer 124 adjacent to a gate area in the depletion mode GaN FET 104. The field plate dielectric layer 126 may include one or more layers of silicon dioxide and/or silicon nitride, and may be, for example, 10 nanometers to 100 nanometers thick. In an alternate version of the instant example, the field plate dielectric layer 126 may be disposed over the enhancement mode gate dielectric layer 122 and the depletion mode gate dielectric layer 124.

An enhancement mode gate 128 is disposed over the enhancement mode gate dielectric layer 122 in the gate recess 120. The enhancement mode gate 128 may overlap the field plate dielectric layer 126 in the enhancement mode GaN FET 102, as depicted in FIG. 1. A depletion mode gate 130 is disposed over the depletion mode gate dielectric layer 124 in the gate area of the depletion mode GaN FET 104 and may overlap the field plate dielectric layer 126 in the depletion mode GaN FET 104, as depicted in FIG. 1. The enhancement mode gate 128 and the depletion mode gate 130 may have substantially equal compositions, possibly as a result of being formed concurrently.

Dielectric isolation structures 132 extend through the cap layer 118, the stressor layer 116 and the barrier layer 114 and possibly through the low-doped layer (112), so as to laterally isolate the enhancement mode GaN FET (102) and the depletion mode GaN FET (104). The dielectric isolation structures 132 may include, for example, silicon dioxide and/or silicon nitride.

A source contact 134 and a drain contact 136 provide electrical connections to a 2DEG in the enhancement mode GaN FET 102. A source contact 138 and a drain contact 140 provide electrical connections to a 2DEG in the depletion mode GaN FET 104.

During operation of the semiconductor device 100, the barrier layer 114 advantageously provides a low carrier density in the 2DEG of the enhancement mode GaN FET 102 under the gate recess 120, so as to provide a desired off-state current. The stressor layer 116 advantageously provides a desired high carrier density in the 2DEG of the enhancement mode GaN FET 102 in the access regions between the gate recess 120 and the source contact 134 and the drain contact 136, so as to provide a desired on-state current. The configuration of the gate recess 120 extending through the stressor layer 116 advantageously contributes to the low carrier density in the 2DEG of the enhancement mode GaN FET 102 under the gate recess 120. The stressor layer 116 extending under the depletion mode gate 130 advantageously provides a desired on-state current in the depletion mode GaN FET 104.

Figure 2A:
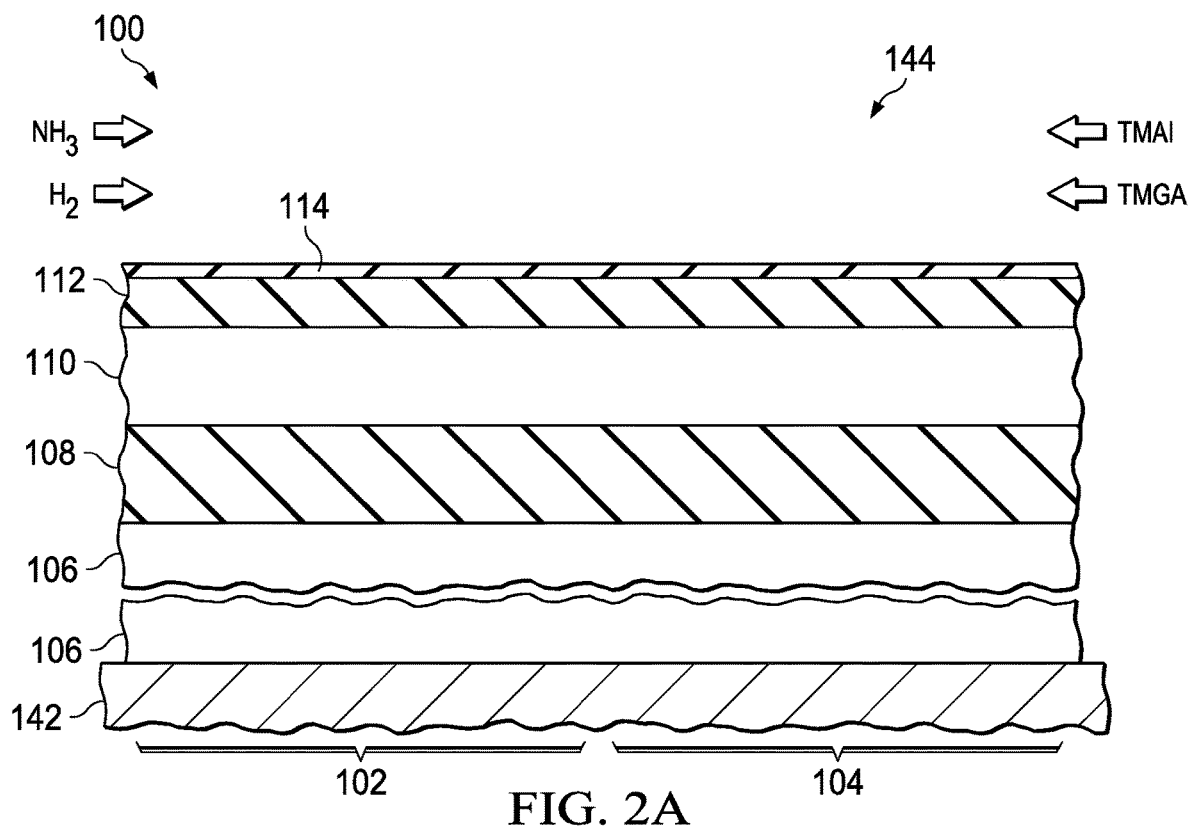
FIG. 2A through FIG. 2I are cross sections of the semiconductor device of FIG. 1 depicted in successive stages of an example fabrication sequence.

FIG. 2A through FIG. 2I are cross sections of the semiconductor device of FIG. 1 depicted in successive stages of an example fabrication sequence. Referring to FIG. 2A, the buffer layer 108 is formed over the substrate 106. The electrical isolation layer (110) is formed over the buffer layer (108), and the low-doped layer (112) is formed over the electrical isolation layer (110). The buffer layer 108, the electrical isolation layer (110) and the low-doped layer (112) may be formed, for example, by a series of MOCVD processes.

In the instant example, process parameters will be described for a case wherein the substrate 106 is a 150 millimeter substrate. The substrate 106 is placed on a susceptor 142, possibly of graphite, in an MOCVD chamber 144. The susceptor 142 is heated, for example by heating coils, to a temperature of 900° C. to 1100° C. A carrier gas such as hydrogen ($H_2$) as indicated in FIG. 2A is flowed into the MOCVD chamber 144 at a flow rate of 80 standard liters per minute (slm) to 120 slm, and a nitrogen source such as ammonia ($NH_3$) as indicated in FIG. 2A is flowed into the MOCVD chamber 144 at a flow rate of 5 slm to 30 slm. An aluminum precursor such as trimethylaluminum (TMAl) as indicated in FIG. 2A, or triethylaluminum, is flowed into the MOCVD chamber 144 at a rate of 80 standard cubic centimeters per minute (sccm) to 130 sccm and a gallium precursor such as trimethylgallium (TMGa) as indicated in FIG. 2A, or triethylgallium, is flowed into the MOCVD chamber 144 at a rate of 40 sccm to 60 sccm. A pressure in the MOCVD chamber 144 is maintained at 50 torr to 200 torr. The nitrogen source, the aluminum precursor and the gallium precursor react at the existing surface of the semiconductor device 100 to form the barrier layer 114 over the low-doped layer 112 in the areas for the enhancement mode GaN FET 102 and the depletion mode GaN FET 104. Forming the barrier layer 114 at a temperature of 900° C. to 1100° C. advantageously provides fewer defects and hence higher reliability for the semiconductor device 100 compared to a barrier layer formed at a lower temperature. In the instant example, substantially no indium precursor is flowed into the MOCVD chamber 144 while the barrier layer 114 is formed. In an alternate version of the instant example, the barrier layer 114 may include a quaternary III-N material, that is, may include another element in addition to aluminum, gallium and nitrogen. The barrier layer 114 may be formed in situ after the low-doped layer (112) to advantageously reduce defects in the semiconductor device (100).

Figure 2B:
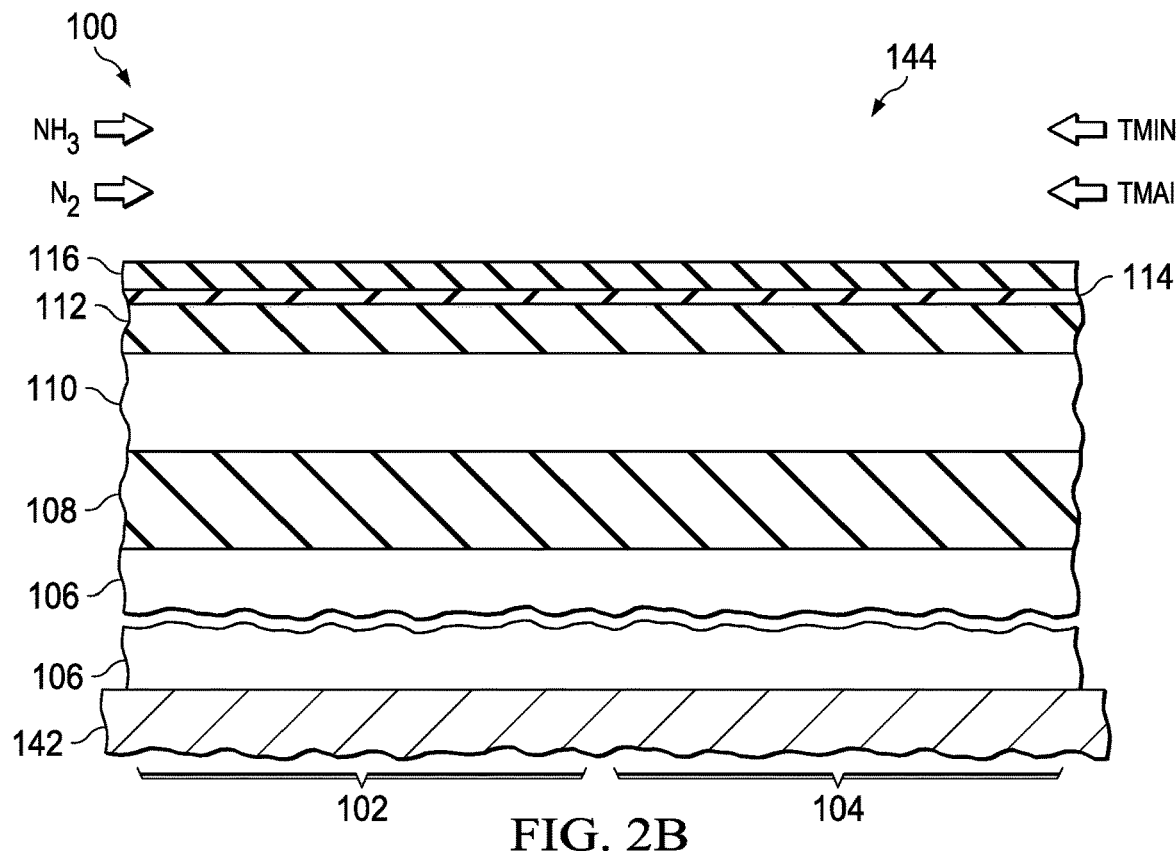

Referring to FIG. 2B, the substrate 106 remains on the susceptor 142 in the MOCVD chamber 144. The susceptor 142 is heated to a temperature of 700° C. to 850° C. A carrier gas, indicated in FIG. 2B as nitrogen ($N_2$), is flowed into the MOCVD chamber 144 at a flow rate of 60 slm to 100 slm, and a nitrogen source, indicated in FIG. 2B as ammonia ($NH_3$), is flowed into the MOCVD chamber 144 at a flow rate of 5 slm to 40 slm. An aluminum precursor, indicated in FIG. 2B as trimethylaluminum (TMAl), is flowed into the MOCVD chamber 144 at a rate of 80 sccm to 130 sccm and an indium precursor such as trimethylindium (TMIn) as indicated in FIG. 2B, or triethylindium, is flowed into the MOCVD chamber 144 at a rate of 100 sccm to 300 sccm. A pressure in the MOCVD chamber 144 is maintained at 100 torr to 400 torr. The nitrogen source, the aluminum precursor and the indium precursor react at the existing surface of the semiconductor device 100 to form the stressor layer 116 over the barrier layer 114 in the areas for the enhancement mode GaN FET 102 and the depletion mode GaN FET 104. Forming the stressor layer 116 at a minimum temperature of 700° C. may advantageously enable a desired concentration of indium and uniform distribution of indium in the stressor layer 116 compared to forming at a lower temperature. Forming the stressor layer 116 at a maximum temperature 850° C. may advantageously reduce indium diffusion into the barrier layer 114 compared to forming at a higher temperature. In the instant example, substantially no aluminum precursor is flowed into the MOCVD chamber 144 while the stressor layer 116 is formed. In an alternate version of the instant example, the stressor layer 116 may include a quaternary III-N material. Forming the stressor layer 116 in situ with the barrier layer 114 may advantageously reduce defects in the semiconductor device (100).

Figure 2C:
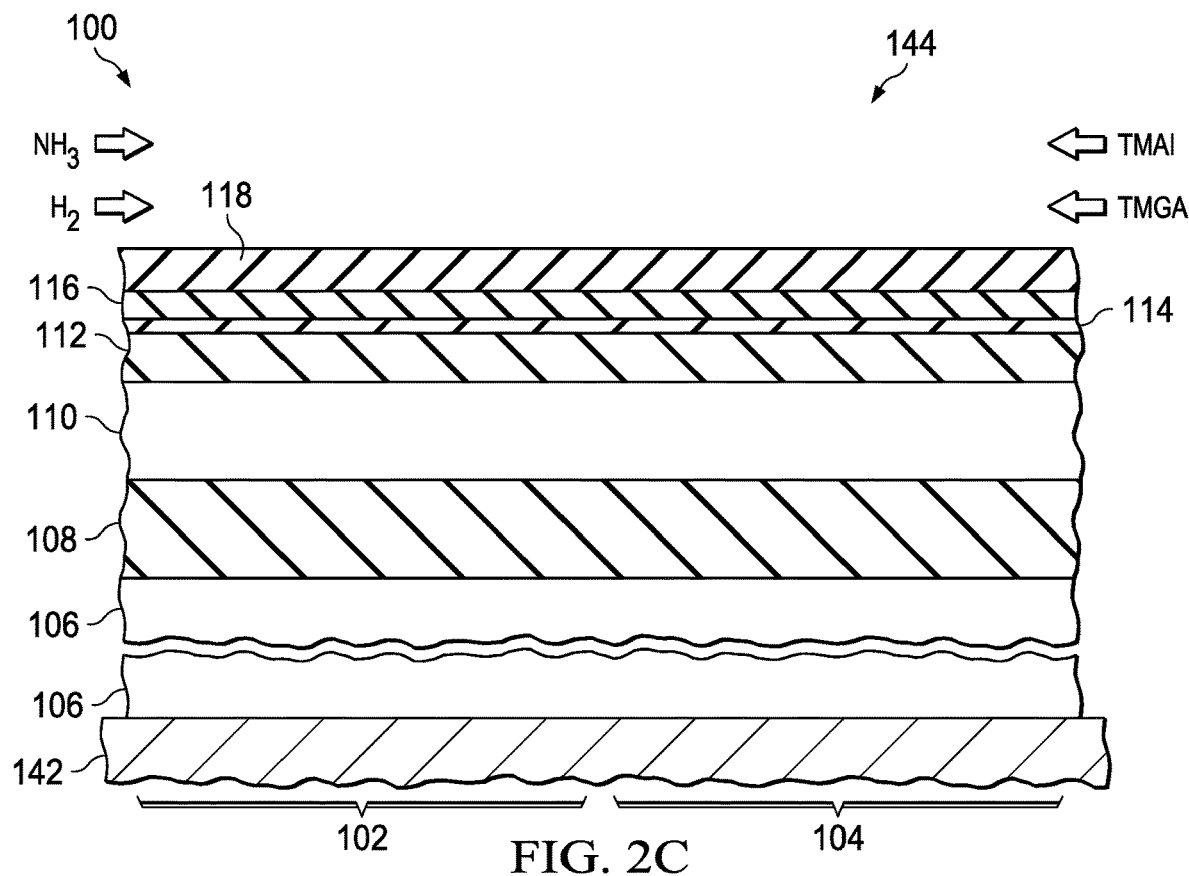

Referring to FIG. 2C, the substrate 106 remains on the susceptor 142 in the MOCVD chamber 144. The susceptor 142 is heated to a temperature of 750° C. to 900° C. A carrier gas, indicated in FIG. 2C as hydrogen ($H_2$), is flowed into the MOCVD chamber 144 at a flow rate of 80 slm to 120 slm, and a nitrogen source, indicated in FIG. 2C as ammonia ($NH_3$), is flowed into the MOCVD chamber 144 at a flow rate of 5 slm to 35 slm. An aluminum precursor, indicated in FIG. 2C as trimethylaluminum (TMAl), is flowed into the MOCVD chamber 144 at a rate of 80 sccm to 130 sccm and a gallium precursor, indicated in FIG. 2C as trimethylgallium (TMGa), is flowed into the MOCVD chamber 144 at a rate of 40 sccm to 60 sccm. A pressure in the MOCVD chamber 144 is maintained at 50 torr to 200 torr. The nitrogen source, the aluminum precursor and the gallium precursor react at the existing surface of the semiconductor device 100 to form the cap layer 118 over the stressor layer 116 in the areas for the enhancement mode GaN FET 102 and the depletion mode GaN FET 104. Forming the cap layer 118 at a maximum temperature of 900° C. may advantageously reduce indium diffusion into the barrier layer 114 and the cap layer 118 compared to forming at a higher temperature. In the instant example, substantially no indium precursor is flowed into the MOCVD chamber 144 while the cap layer 118 is formed. The cap layer 118 may be formed in situ after the stressor layer (116) to advantageously reduce defects in the semiconductor device (100).

Figure 2D:
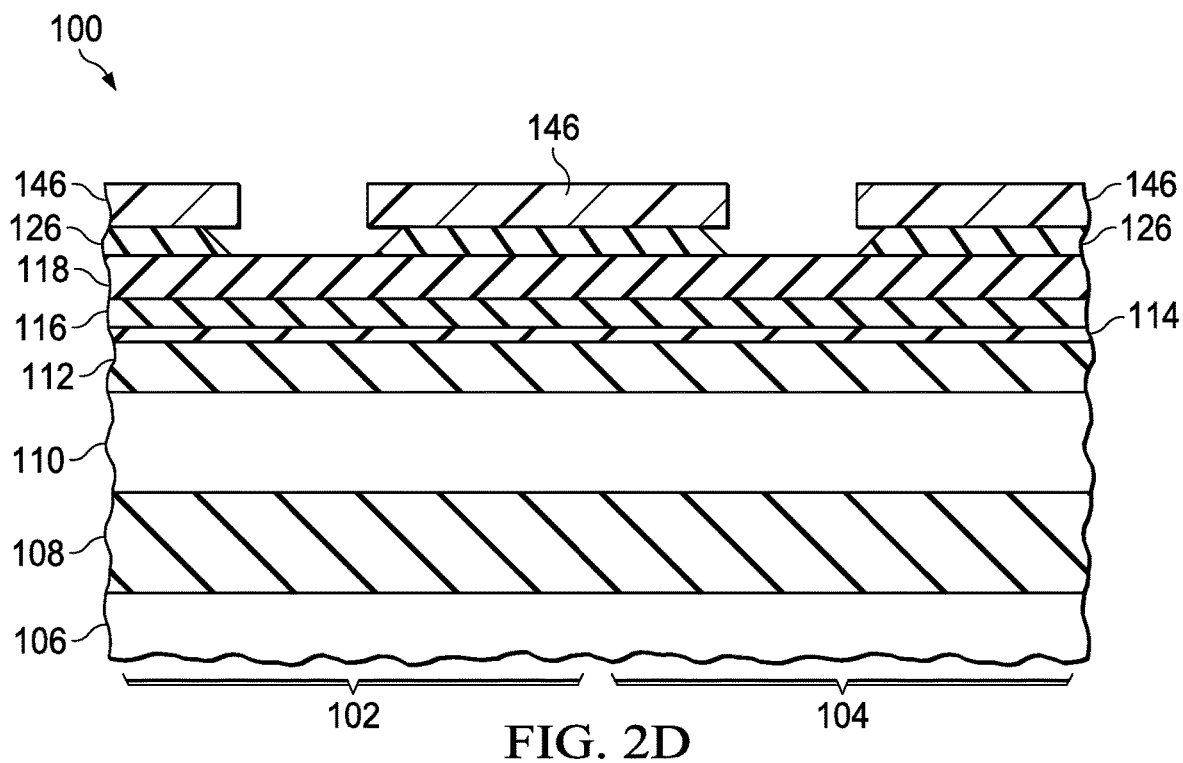

Referring to FIG. 2D, the field plate dielectric layer 126 is formed over the cap layer 118. The field plate dielectric layer 126 may be formed, for example, by forming a layer of dielectric material containing silicon dioxide and/or silicon nitride over the cap layer by a plasma enhanced chemical vapor deposition (PECVD) process. A field plate mask 146 is formed over the layer of dielectric material so as to expose gate areas for the enhancement mode GaN FET 102 and the depletion mode GaN FET 104. The layer of dielectric material is removed where exposed by the field plate mask 146 by an etch process such as a plasma etch process at over 100 torr, forming the field plate dielectric layer 126 with sloped sides as depicted in FIG. 2D.

Figure 2E:
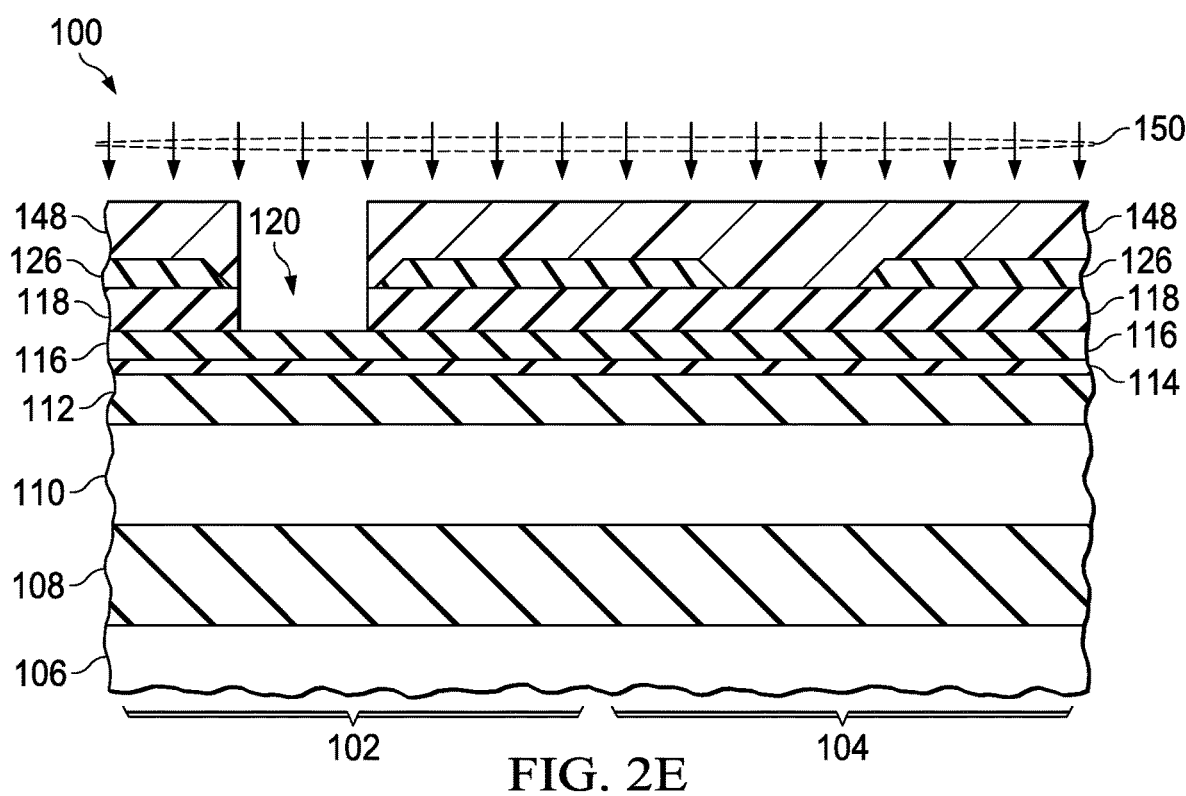

Referring to FIG. 2E, a recess mask 148 is formed over the cap layer 118 to expose an area in the enhancement mode GaN FET 102 for the gate recess 120. The recess mask 148 may include photoresist and may be formed by a photolithographic process. The recess mask 148 may further include an antireflection layer such as an organic bottom antireflection coating (BARC) and/or a hard mask layer such as silicon dioxide or silicon nitride. The recess mask 148 covers the area for the depletion mode GaN FET 104.

A first etch process 150 such as a plasma etch process using chlorine radicals removes the cap layer 118 in the area exposed by the recess mask 148 to form a portion of the gate recess 120. The indium in the stressor layer 116 has a lower etch rate in the first etch process 150 than the cap layer 118, so at least a portion of the stressor layer 116 remains in the area for the gate recess 120 after the first etch process 150 is completed. The first etch process 150 may be, for example, an inductively-coupled plasma reactive ion etch (ICP-RIE) process using chlorine ($Cl_2$) gas sulfur hexafluoride ($SF_6$) gas, which has been demonstrated to desirably provide an etch selectivity of gallium aluminum nitride to indium aluminum nitride greater than 1.0. Forming the cap layer 118 at a maximum temperature of 900° C., in combination with the indium content in the stressor layer 116, may advantageously increase the etch selectivity for the first etch process 150 so as to reduce the amount, if any, of the stressor layer 116 removed by the first etch process 150.

Figure 2F:
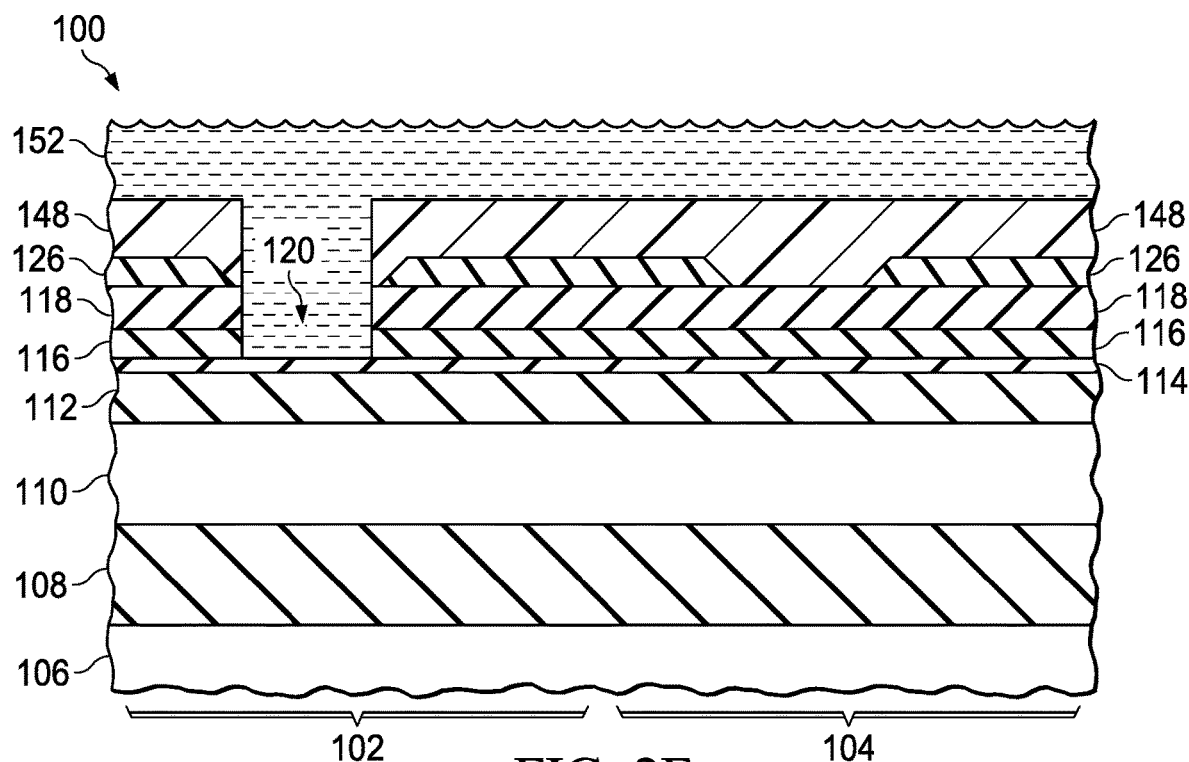

Referring to FIG. 2F, a second etch process 152 removes the stressor layer 116 in the gate recess 120 to form the complete gate recess 120. The second etch process 152 has a different chemistry than the first etch process 150 of FIG. 2E. The barrier layer 114 has a lower etch rate in the second etch process 152 than the stressor layer 116, so at least a portion, and possibly all, of the barrier layer 114 remains under the gate recess 120 after the second etch process 152 is completed. The second etch process 152 may include, for example, a wet etch process using a 1 molar aqueous solution of 1,2 diaminoethane, which has been demonstrated to desirable provide an etch selectivity of indium aluminum nitride to gallium aluminum nitride eater than 1.0 at room temperature. The first etch process 150 may provide a desirably rough surface on the exposed stressor layer 116 which may advantageously provide a more uniform initial etch rate for the second etch process 152.

Figure 2G:
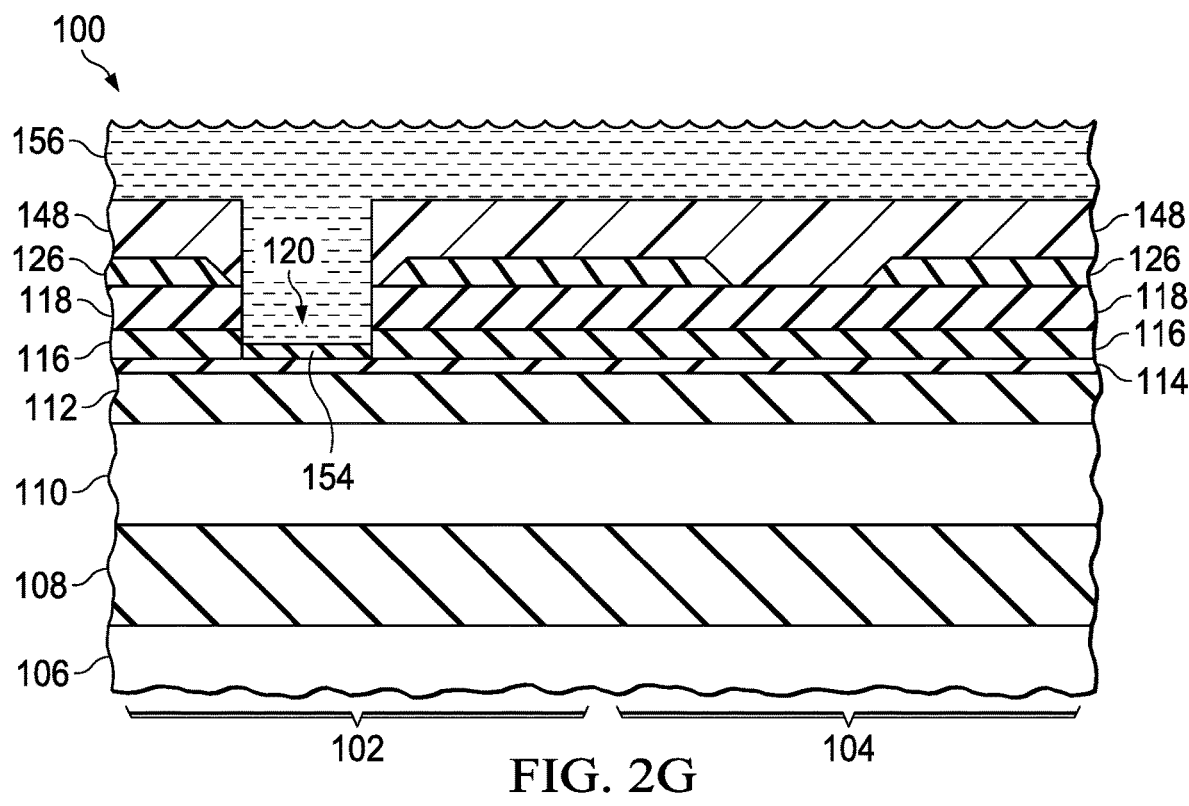

Referring to FIG. 2G, there may be a remaining portion 154 of the stressor layer 116 in the gate recess 120, possibly a transition layer 154 which includes elements of the underlying barrier layer 114. An oxidizing liquid 156 oxidizes the remaining portion 154 of the stressor layer 116 in the gate recess 120. The remaining portion 154 of the stressor layer 116 may be oxidized by an anodic oxidation process in which electrical current is passed through the oxidizing liquid 156. For example, the oxidizing liquid 156 may be an aqueous solution of nitriloacetic acid and 0.3 molar potassium hydroxide (KOH) with a pH value of 8.5. The electrical current may have a value of about 20 microamperes per square centimeter of exposed stressor layer 116. The oxidized remaining portion 154 may be subsequently removed, for example by a wet etch process using a dilute aqueous acidic solution, such as a dilute nitric acid solution or a citric acid solution. The recess mask 148 is removed, possibly after the wet etch process 152 of FIG. 2F is completed, or possibly earlier.

Figure 2H:
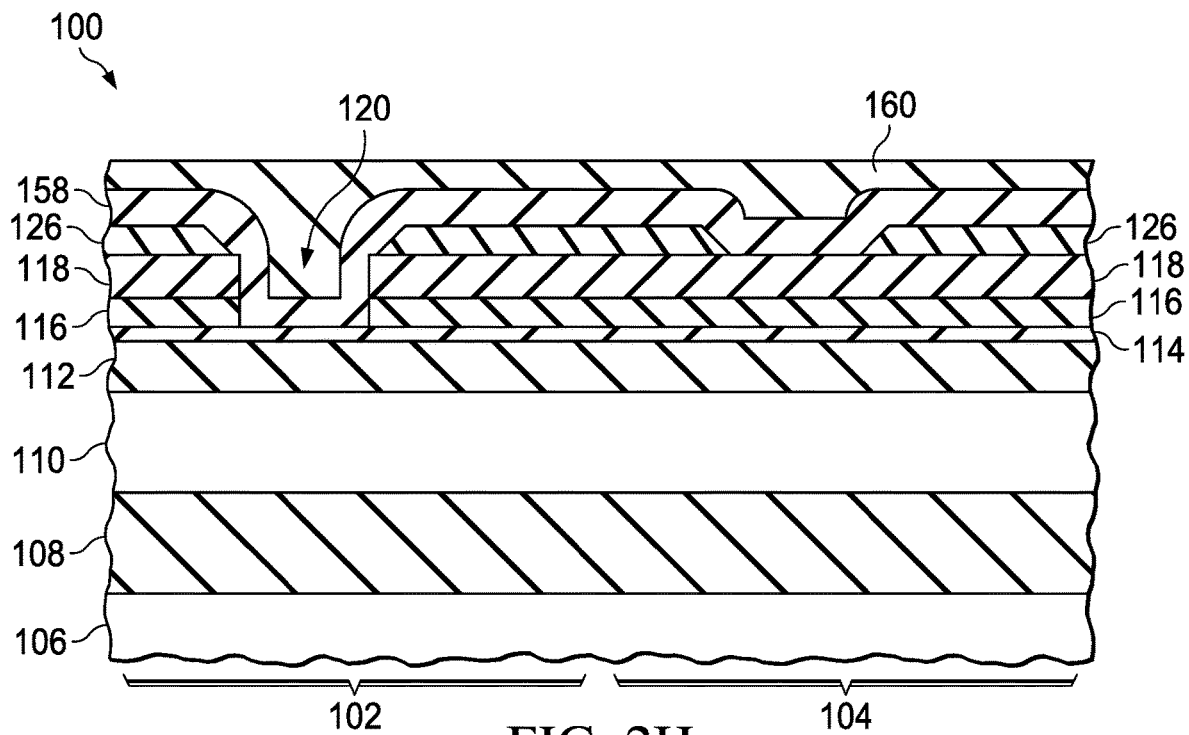

Referring to FIG. 2H, a layer of gate dielectric material 158 is formed over the field plate dielectric layer 126, extending into the gate recess 120 and overlying the barrier layer 114 at a bottom of the gate recess 120. In the instant example, the layer of gate dielectric material 158 extends over the cap layer 118 in the depletion mode GaN FET 104. The layer of gate dielectric material 158 may include one or more layers of silicon dioxide and/or silicon nitride, formed, for example, by PECVD processes. A layer of gate material 160 is formed over the layer of gate dielectric material 158. The layer of gate material 160 may include, for example, gallium nitride or other III-N material, or may include polycrystalline silicon, referred to as polysilicon, or may include metal. In the instant example, the layer of gate material 160 is formed in the areas for the gates of both the enhancement mode GaN FET 102 and the depletion mode GaN FET 104.

Figure 2I:
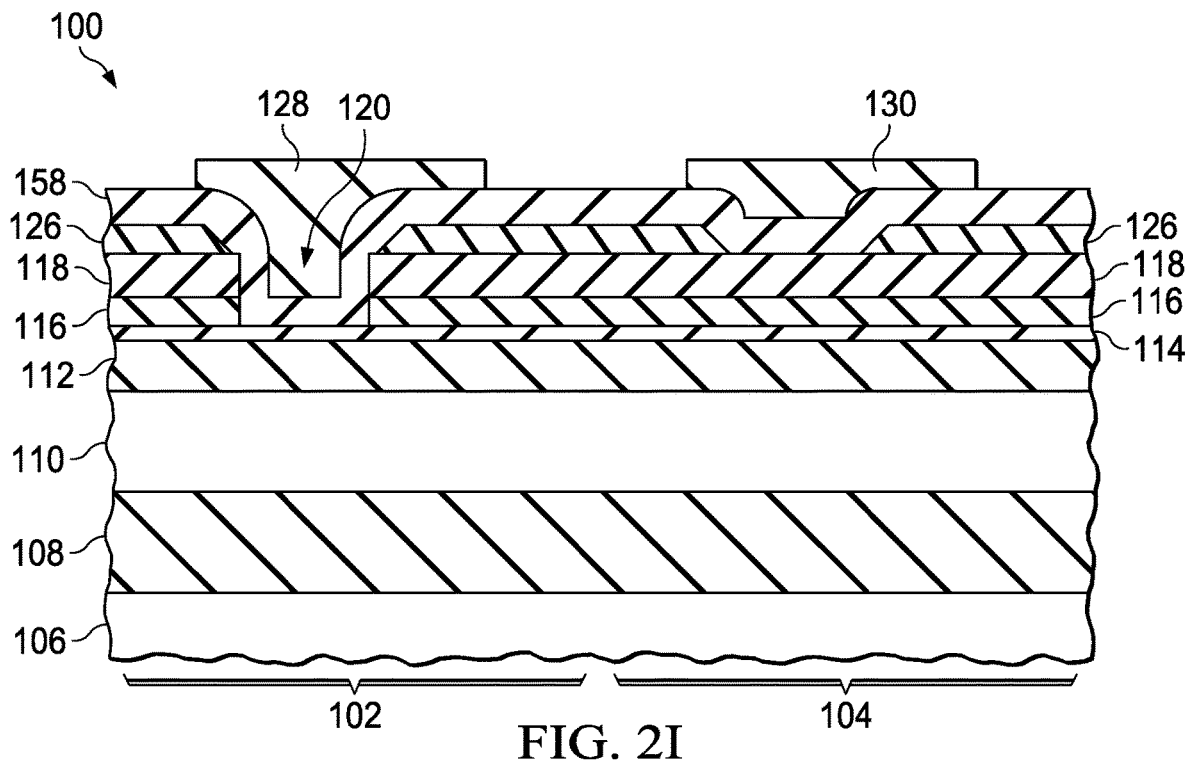

Referring to FIG. 2I, the layer of gate material 160 of FIG. 2H is patterned to concurrently form the enhancement mode gate 128 and the depletion mode gate 130. The enhancement mode gate 128 and the depletion mode gate 130 may be formed by an etch process: forming an etch mask over the layer of gate material 160 which covers area for the enhancement mode gate 128 and the depletion mode gate 130, and subsequently removing the layer of gate material 160 where exposed by the etch mask. Alternatively, the enhancement mode gate 128 and the depletion mode gate 130 may be formed by a liftoff process: forming a liftoff mask of solvent-soluble organic material such as photoresist which exposes the layer of gate dielectric material 158 in the areas for the enhancement mode gate 128 and the depletion mode gate 130, forming the layer of gate material 160 over the liftoff mask, and subsequently removing the liftoff mask and the overlying layer of gate material 160, leaving the layer of gate material 160 in the areas exposed by the liftoff mask to provide the enhancement mode gate 128 and the depletion mode gate 130. Forming the enhancement mode gate 128 and the depletion mode gate 130 concurrently may advantageously reduce fabrication cost and complexity of the semiconductor device 100. In an alternate version of the instant example, the enhancement mode gate 128 and the depletion mode gate 130 may be formed separately, of materials with different work functions, to increase performance of both the enhancement mode GaN FET 102 and the depletion mode GaN FET 104. After forming the enhancement mode GaN FET 102 and the depletion mode GaN FET 104, fabrication is continued to provide the structure of FIG. 1.

Figure 3A:
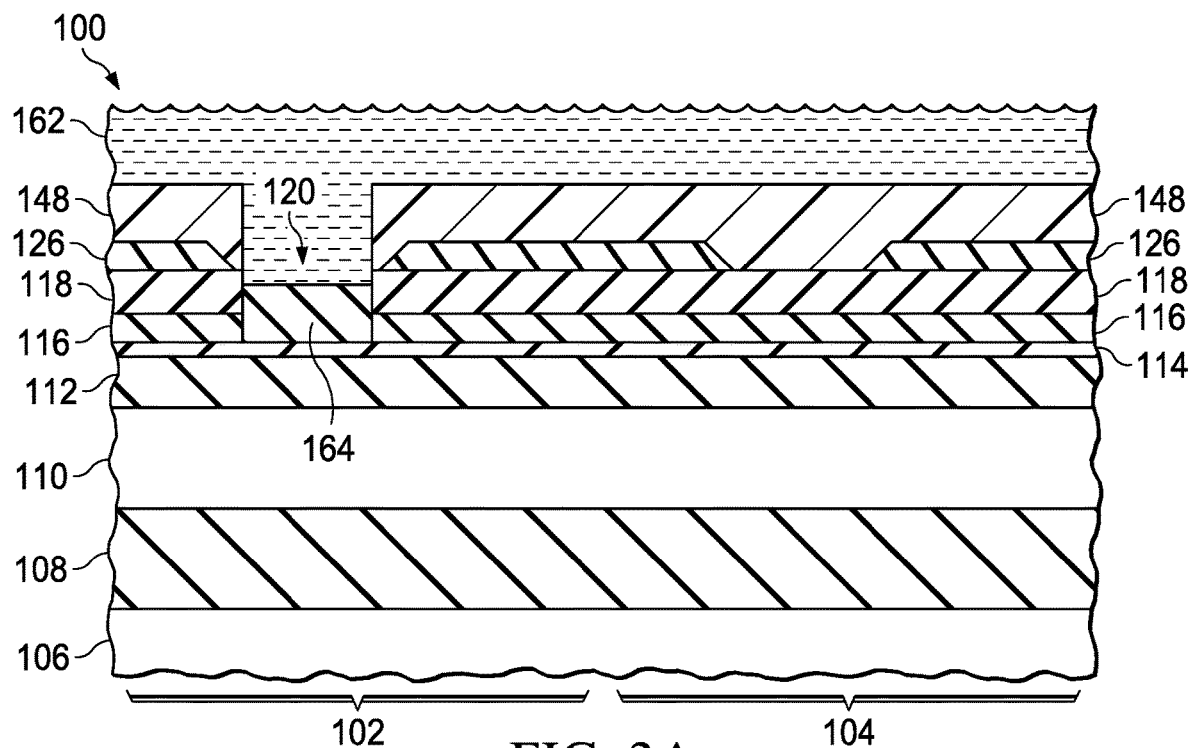
FIG. 3A and FIG. 3B are cross sections of the semiconductor device of FIG. 1 depicted in an alternate process sequence for forming the gate recess.
Figure 3B:
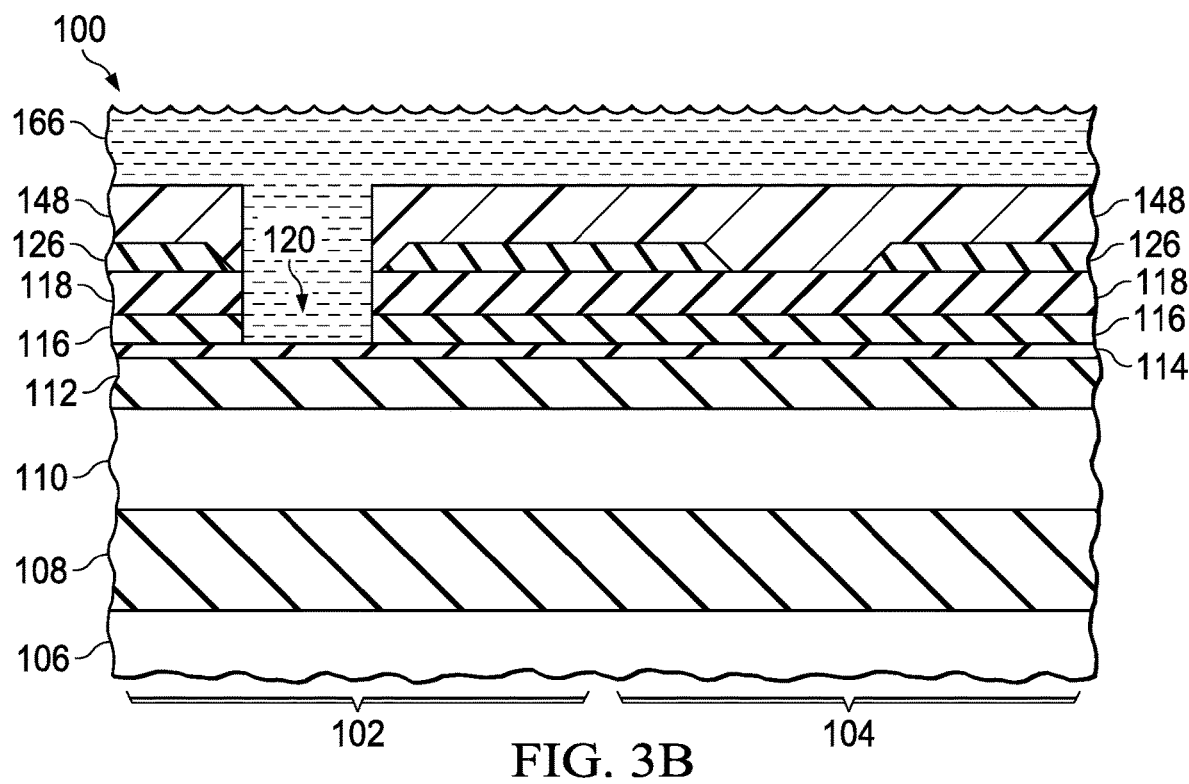

FIG. 3A and FIG. 3B are cross sections of the semiconductor device of FIG. 1 depicted in an alternate process sequence for forming the gate recess. Referring to FIG. 3A, the recess mask 148 is formed over the cap layer 118. The cap layer 118 is removed in the area exposed by the recess mask 148 to form a portion of the gate recess 120, as described in reference to FIG. 2E. An oxidizing liquid 162, for example an anodizing aqueous solution containing an aqueous solution of nitriloacetic acid and 0.3 molar KOH with a pH value of 8.5 with an electrical current of about 20 microamperes per square centimeter of exposed stressor layer 116, oxidizes the stressor layer 116 where exposed by the cap layer 118 in the gate recess 120 to form an oxidized stressor layer 164 which includes indium oxide. In the instant example, the barrier layer 114 may include a layer of gallium nitride (GaN) 1 nanometer to 3 nanometers thick immediately below the stressor layer 116 to prevent oxidation of the aluminum gallium nitride in the barrier layer 114. At least a portion of the barrier layer 114 under the stressor layer 116 in the gate recess 120 is not oxidized.

Referring to FIG. 3B, a second etch process 166 removes the oxidized stressor layer 164 of FIG. 3A to form the gate recess 120, while leaving at least a portion, and possibly all, of the barrier layer 114 under the gate recess 120. The second etch process 166 may include, for example, a dilute aqueous solution of nitric acid, phosphoric acid, and/or hydrochloric acid, or an aqueous solution of an organic acid such as citric acid. The oxidation process described in reference to FIG. 3A and the second etch process of FIG. 3B may be repeated to completely remove the stressor layer 116 from the gate recess 120. The recess mask 148 is removed and fabrication is continued as described in reference to FIG. 2G.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:
   forming a buffer layer over a substrate;
   forming an electrically isolating III-N layer over the buffer layer;
   forming a low-doped layer of III-N material over the electrically isolating III-N layer, in an area for an enhancement mode GaN FET;
   forming a barrier layer of III-N material over the low-doped layer, the barrier layer having less than 1 atomic percent indium;
   forming a stressor layer of III-N material over the barrier layer, the stressor layer having a stoichiometry of $In_{0.05}Al_{0.95}N$ to $In_{0.30}Al_{0.70}N$, and a thickness of 1 nanometers to 5 nanometers;
   forming a cap layer of III-N material over the stressor layer;
   forming a recess mask over the cap layer which exposes an area for a gate recess in the area for the enhancement mode GaN FET;
   removing the cap layer in the area exposed by the recess mask by a first etch process to form a portion of the gate recess of the enhancement mode GaN FET, the first etch process leaving at least a portion of the stressor layer under the area exposed by the recess mask;
   removing the stressor layer in the area exposed by the recess mask by a second etch process to form the gate recess, the second etch process having a different chemistry than the first etch process, the second etch process leaving at least a portion of the barrier layer under the gate recess;
   forming a gate dielectric layer over the barrier layer in the gate recess; and
   forming a gate of the enhancement mode GaN FET over the gate dielectric layer in the gate recess.

2. The method of claim 1, wherein the barrier layer, the stressor layer and the cap layer are formed in one MOCVD chamber.

3. The method of claim 1, wherein the first etch process comprises a plasma etch process with chlorine radicals.

4. The method of claim 1, wherein the second etch process comprises a wet etch process with an aqueous solution of 1,2 diaminoethane.

5. The method of claim 1, comprising oxidizing the stressor layer in the area exposed by the recess mask to form an oxidized stressor layer, after removing the cap layer in the area exposed by the recess mask, wherein the second etch process removes the oxidized stressor layer.

6. The method of claim 1, wherein the gate dielectric layer extends over the cap layer, the stressor layer and the barrier layer in an area for a gate of a depletion mode GaN FET of the semiconductor device.

7. The method of claim 6, wherein forming the gate of the enhancement mode GaN FET comprises:
   forming a layer of gate material over the gate dielectric layer in the gate recess and in the area for the gate of the depletion mode GaN FET; and
   forming the gate of the enhancement mode GaN FET concurrently with the gate of the depletion mode GaN FET from the layer of gate material.

8. A method of forming a semiconductor device, comprising the steps:
   forming a first layer of III-N material over a substrate, in an area for an enhancement mode GaN FET;
   forming a second layer of III-N material by a metal-organic chemical vapor deposition (MOCVD) process over the first layer, the second layer having less than 1 atomic percent indium;
   forming a third layer of III-N material by an MOCVD process over the second layer, the third layer having a stoichiometry of $In_{0.05}Al_{0.95}N$ to $In_{0.30}Al_{0.70}N$, and a thickness of 1 nanometers to 5 nanometers;
   forming a fourth layer of III-N material by an MOCVD process over the third layer;
   forming a recess mask over the fourth layer which exposes an area for a gate recess in the area for the enhancement mode GaN FET;
   removing the fourth layer in the area exposed by the recess mask by a first etch process to form a portion of the gate recess of the enhancement mode GaN FET, the first etch process leaving at least a portion of the third layer under the area exposed by the recess mask;
   removing the third layer in the area exposed by the recess mask by a second etch process to form the gate recess, the second etch process having a different chemistry than the first etch process, the second etch process leaving at least a portion of the second layer under the gate recess;
   oxidizing at least a portion of the third layer, wherein oxidizing at least a portion of the third layer oxidizes a remaining portion of the third layer left in the area exposed by the recess mask after the step of removing the third layer by the second etch process and further comprising removing the oxidized remaining portion using a wet etch process;
   forming a gate dielectric layer over the second layer in the gate recess; and
   forming a gate of the enhancement mode GaN FET over the gate dielectric layer in the gate recess.

9. The method of claim 8, wherein the second layer, the third layer and the fourth layer are formed in one MOCVD chamber.

10. The method of claim 8, wherein the first etch process comprises a plasma etch process with chlorine radicals.

11. The method of claim 8, wherein the second etch process comprises a wet etch process with an aqueous solution of 1,2 diaminoethane.

12. The method of claim 8, wherein the gate dielectric layer extends over the fourth layer, the third layer and the second layer in an area for a gate of a depletion mode GaN FET of the semiconductor device.

13. A method of forming a semiconductor device, comprising the steps:

forming a low-doped layer of III-N material over a substrate, in an area for an enhancement mode GaN FET;

forming a barrier layer of III-N material by a metal organic chemical vapor deposition (MOCVD) process over the low-doped layer, the barrier layer having less than 1 atomic percent indium;

forming a stressor layer of III-N material by an MOCVD process over the barrier layer, the stressor layer having a stoichiometry of $In_{0.05}Al_{0.95}N$ to $In_{0.30}Al_{0.70}N$, and a thickness of 1 nanometers to 5 nanometers;

forming a cap layer of III-N material by an MOCVD process over the stressor layer;

forming a recess mask over the cap layer which exposes an area for a gate recess in the area for the enhancement mode GaN FET;

removing the cap layer in the area exposed by the recess mask by a first etch process to form a portion of the gate recess of the enhancement mode GaN FET, the first etch process leaving at least a portion of the stressor layer under the area exposed by the recess mask;

removing the stressor layer in the area exposed by the recess mask by a second etch process to form the gate recess, the second etch process having a different chemistry than the first etch process, the second etch process leaving at least a portion of the barrier layer under the gate recess;

forming a gate dielectric layer over the barrier layer in the gate recess; and forming a gate of the enhancement mode GaN FET over the gate dielectric layer in the gate recess, wherein the substrate is a 150 millimeter wafer, and forming the barrier layer comprises:

placing the substrate on a susceptor in an MOCVD chamber;

heating the susceptor to a temperature of 900° C. to 1100° C.;

flowing hydrogen gas into the MOCVD chamber at a flow rate of 80 standard liters per minute (slm) to 120 slm;

flowing a nitrogen source into the MOCVD chamber at a flow rate of 5 slm to 30 slm;

flowing an aluminum precursor into the MOCVD chamber at a rate of 80 standard cubic centimeters per minute (sccm) to 130 sccm;

flowing a gallium precursor into the MOCVD chamber at a rate of 40 sccm to 160 sccm; and maintaining a pressure in the MOCVD chamber at 50 torr to 200 torr.

14. A method of forming a semiconductor device, comprising the steps:

forming a low-doped layer of III-N material over a substrate, in an area for an enhancement mode GaN FET;

forming a barrier layer of III-N material by a metal organic chemical vapor deposition (MOCVD) process over the low-doped layer, the barrier layer having less than 1 atomic percent indium;

forming a stressor layer of III-N material by an MOCVD process over the barrier layer, the stressor layer having a stoichiometry of $In_{0.05}Al_{0.95}N$ to $In_{0.30}Al_{0.70}N$, and a thickness of 1 nanometers to 5 nanometers;

forming a cap layer of III-N material by an MOCVD process over the stressor layer;

forming a recess mask over the cap layer which exposes an area for a gate recess in the area for the enhancement mode GaN FET;

removing the cap layer in the area exposed by the recess mask by a first etch process to form a portion of the gate recess of the enhancement mode GaN FET, the first etch process leaving at least a portion of the stressor layer under the area exposed by the recess mask;

removing the stressor layer in the area exposed by the recess mask by a second etch process to form the gate recess, the second etch process having a different chemistry than the first etch process, the second etch process leaving at least a portion of the barrier layer under the gate recess;

forming a gate dielectric layer over the barrier layer in the gate recess; and forming a gate of the enhancement mode GaN FET over the gate dielectric layer in the gate recess, wherein the substrate is a 150 millimeter wafer, and forming the stressor layer comprises:

placing the substrate on a susceptor in an MOCVD chamber;

heating the susceptor to a temperature of 700° C. to 850° C.;

flowing nitrogen gas into the MOCVD chamber at a flow rate of 60 slm to 100 slm;

flowing a nitrogen source into the MOCVD chamber at a flow rate 5 slm to 40 slm;

flowing an aluminum precursor into the MOCVD chamber at a rate of 80 sccm to 130 sccm;

flowing a indium precursor into the MOCVD chamber at a rate 100 sccm to 300 sccm; and maintaining a pressure in the MOCVD chamber at 100 torr to 400 torr.

15. A method of forming a semiconductor device, comprising the steps:

forming a low-doped layer of III-N material over a substrate, in an area for an enhancement mode GaN FET;

forming a barrier layer of III-N material by a metal organic chemical vapor deposition (MOCVD) process over the low-doped layer, the barrier layer having less than 1 atomic percent indium;

forming a stressor layer of III-N material by an MOCVD process over the barrier layer, the stressor layer having a stoichiometry of $In_{0.05}Al_{0.95}N$ to $In_{0.30}Al_{0.70}N$, and a thickness of 1 nanometers to 5 nanometers;

forming a cap layer of III-N material by an MOCVD process over the stressor layer;

forming a recess mask over the cap layer which exposes an area for a gate recess in the area for the enhancement mode GaN FET;

removing the cap layer in the area exposed by the recess mask by a first etch process to form a portion of the gate recess of the enhancement mode GaN FET, the first etch process leaving at least a portion of the stressor layer under the area exposed by the recess mask;

removing the stressor layer in the area exposed by the recess mask by a second etch process to form the gate recess, the second etch process having a different chemistry than the first etch process, the second etch process leaving at least a portion of the barrier layer under the gate recess;

forming a gate dielectric layer over the barrier layer in the gate recess; and forming a gate of the enhancement mode GaN FET over the gate dielectric layer in the gate recess, wherein the substrate is a 150 millimeter wafer, and forming the cap layer comprises:

placing the substrate on a susceptor in an MOCVD chamber;

heating the susceptor to a temperature of 750° C. to 900° C.;

flowing nitrogen gas into the MOCVD chamber at a flow rate of 80 slm to 120 slm;

flowing a nitrogen source into the MOCVD chamber at a flow rate of 5 slm to 35 slm;

flowing an aluminum precursor into the MOCVD chamber at a rate of 80 sccm to 130 sccm;

flowing a gallium precursor into the MOCVD chamber at a rate of 40 sccm to 60 sccm; and maintaining a pressure in the MOCVD chamber at 50 torr to 200 torr.

16. A method of forming a semiconductor device, comprising the steps:

forming a low-doped layer of III-N material over a substrate, in an area for an enhancement mode GaN FET;

forming a barrier layer of III-N material over the low-doped layer;

forming a stressor layer of III-N material over the barrier layer, the stressor layer comprising InAlN;

forming a cap layer of III-N material over the stressor layer;

forming a recess mask over the cap layer which exposes an area for a gate recess in the area for the enhancement mode GaN FET;

removing the cap layer in the area exposed by the recess mask by a first etch process to form a portion of the gate recess of the enhancement mode GaN FET, the first etch process leaving at least a portion of the stressor layer under the area exposed by the recess mask;

removing the stressor layer in the area exposed by the recess mask by a second etch process to form the gate recess, the second etch process having a different chemistry than the first etch process, the second etch process leaving at least a portion of the barrier layer under the gate recess;

forming a gate dielectric layer over the barrier layer in the gate recess; and forming a gate of the enhancement mode GaN FET over the gate dielectric layer in the gate recess; and oxidizing a remaining portion of the stressor layer left in the area exposed by the recess mask after the step of removing the stressor layer by the second etch process and removing the oxidized remaining portion using a wet etch process.

* * * * *